(12) United States Patent
Sonoda et al.

(10) Patent No.: US 6,576,112 B2
(45) Date of Patent: Jun. 10, 2003

(54) METHOD OF FORMING ZINC OXIDE FILM AND PROCESS FOR PRODUCING PHOTOVOLTAIC DEVICE USING IT

(75) Inventors: Yuichi Sonoda, Nara (JP); Noboru Toyama, Osaka (JP); Yusuke Miyamoto, Kyoto (JP); Hidetoshi Tsuzuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/953,256

(22) Filed: Sep. 17, 2001

(65) Prior Publication Data

US 2002/0063065 A1 May 30, 2002

(30) Foreign Application Priority Data

Sep. 19, 2000 (JP) .......................... 2000-283065

(51) Int. Cl.$^7$ .................... C23C 28/00; C25D 11/02; H01L 31/18
(52) U.S. Cl. .................. 205/155; 136/256; 205/314; 205/333; 205/188; 205/305; 205/124; 205/316; 438/95; 438/98; 438/104; 438/608; 438/609; 438/678; 427/74
(58) Field of Search ................ 136/256; 205/155, 205/314, 333, 188, 305, 124, 316; 438/95, 98, 104, 608, 609, 678; 427/74

(56) References Cited

U.S. PATENT DOCUMENTS

| | | | |
|---|---|---|---|
| 5,486,238 A | 1/1996 | Nakagawa et al. | 136/259 |
| 5,770,463 A | 6/1998 | Nakagawa et al. | 438/62 |
| 5,804,466 A * | 9/1998 | Arao et al. | 438/95 |
| 6,133,061 A | 10/2000 | Sonoda | 438/69 |
| 6,238,808 B1 * | 5/2001 | Arao et al. | 428/629 |
| 6,346,184 B1 * | 2/2002 | Sano et al. | 205/199 |
| 6,383,359 B2 * | 5/2002 | Arao et al. | 205/155 |

FOREIGN PATENT DOCUMENTS

| | | |
|---|---|---|
| EP | 932207 A2 * | 7/1999 |
| JP | 4-119843 | 4/1992 |
| JP | 6-21494 | 1/1994 |
| JP | 10-140373 | 5/1998 |

OTHER PUBLICATIONS

Technical Disgest of the International PVSEC–5, Kyoto, Japan, 1990, "Multi–Bandgap Stacked Solar Cells With Bandgap Profiling". H. Sannomiya, S. Moriuchi, Y. Inoue, K. Nomoto, A. Yokota, M. Itoh, Y. Nakata, and T.Tsuji.

* cited by examiner

Primary Examiner—Alan Diamond
(74) Attorney, Agent, or Firm—Fitzpatrick, Cella, Harper & Scinto

(57) ABSTRACT

The present invention provides a method of forming a zinc oxide film on a conductive substrate, which comprises dipping the conductive substrate and a counter electrode in an aqueous solution containing at least nitric acid ion and zinc ion and supplying a current between these electrodes to form a zinc oxide film, wherein the aqueous solution further contains polycarboxylic acid in which a carboxyl radical is bonded to each of carbon having sp2 hybrid orbital, or its ester with a concentration of 0.5 $\mu$mol/L to 500 $\mu$mol/L. Thereby, it is possible to form in a short time a thin film having texture structure exhibiting an optical confinement effect, to prevent abnormal growth of a deposited film, and to obtain a zinc oxide thin film having excellent uniformity and adhesion on a surface thereof where the film is formed. Also, by applying the photovoltaic device to a stacked structure, it is possible to enhance the photoelectric characteristics and mass producibility.

7 Claims, 6 Drawing Sheets

ADDTION AMOUNT OF PHTHALIC ACID:

10 μmol/L

ADDTION AMOUNT OF PHTHALIC ACID:

70 μmol/L

ADDTION AMOUNT OF PHTHALIC ACID:

100 μmol/L

METHOD OF FORMING ZINC OXIDE FILM AND PROCESS FOR PRODUCING PHOTOVOLTAIC DEVICE USING IT

BACKGROUND OF THE INVENTION

1. Field of the Invention

The present invention relates to a method of forming a zinc oxide thin film and a process for a photovoltaic device using it.

2. Related Background Art

Conventionally, a photovoltaic device composed of hydrogenated amorphous silicon, hydrogenated amorphous germanium silicon, hydrogenated amorphous carbide silicon, microcrystalline silicon or polycrystalline silicon and the like has utilized a reflecting layer on the back surface of the device in order to improve a current collection efficiency in long wavelength. For such a reflecting layer, it is preferable that a reflecting layer shows effective reflection characteristics at wavelengths, at which the absorption of long wavelengths is reduced near the edge of a band in the semiconductor material, that is, 800 nm to 1200 nm. It is a metal such as gold, silver, copper and aluminum that sufficiently satisfies this condition. Also, it has also been performed to provide an optically transparent texture layer within a predetermined wavelength range, which is known as optical confinement, and generally, the texture layer may be provided between the metal layer and a semiconductor active layer to improve a short-circuit current density (Jsc) by effectively utilizing reflected light. Further, in order to prevent the characteristics from being deteriorated due to a shunt path, between this metal layer and the semiconductor layer, there has been provided a layer made of light-transmissive, conductive material, that is, a transparent conductive layer. Exceedingly generally, these layers are deposited by a method such as vacuum evaporation and sputtering, and have been improved by 1 $mA/cm^2$ or higher in terms of short-circuit current density (Jsc).

As their examples, in prior art 1: "29p-MF-2 Optical confinement effect in a-SiGe solar cells on a stainless steel substrates" (1990 autumn) the Extended Abstract of 51st Science Lecture Meeting of the Japan Society of Applied Physics, p747, and prior art 2: "P-IA-15a-SiC/a-Si/a-SiGe Multi-Bandgap Stacked Solar Cells With Bandgap Profiling", Sannomiya et al., Technical Digest of the International PVSEC-5, Kyoto, Japan, p381, 1990, and the like, the reflection factor and texture structure of a reflecting layer made of silver atom have been studied. In these examples, they disclose that an effective texture is formed by depositing as the reflecting layer two layers of silver different in substrate temperature, whereby increased short-circuit current due to the optical confinement effect has been achieved by means of combination with the zinc oxide layer.

A transparent layer to be used as the optical confinement layer as described above is deposited by means of the vacuum evaporation method using resistance heating or electron beams, the sputtering method, the ion plating method, the CVD method or the like, and high wages for preparing target materials and the like, a high depreciation cost for the vacuum apparatus and low utilization efficiency of the materials increase the cost of the photovoltaic device using these techniques to an exceedingly high cost, and cause great obstacles to apply the solar cells for industrial use.

As a measure against them, as zinc oxide-producing technique using the liquid phase deposition method, in Japanese Patent Application Laid-Open No 10-140373, there has been explained a combination of a metal layer and a transparent conductive layer to be applied as a reflecting layer of the photovoltaic device (solar cell).

According to these methods, it is possible to dramatically reduce the cost for producing zinc oxide because there is no need for an expensive vacuum apparatus and a high-cost target. Also, since it is possible to deposit also on a large-area substrate, this holds great promise for such a large-area photovoltaic device as the solar cell. However, these methods of electrochemically depositing zinc oxide have the following problems.

(1) A deposited film having texture structure having more effective optical confinement effect requires further study.

(2) Abnormal growth having a shape such as sphere and dendrite is liable to occur, and causes the adhesion to be reduced. Further, when this zinc oxide film is used as a part of the photovoltaic device, the abnormal growth causes a shunt path of the photovoltaic device to be brought about.

(3) Variations are prone to occur in the size of the zinc oxide crystal grains, and the uniformity when made into a large area poses a problem.

SUMMARY OF THE INVENTION

The present invention has been achieved in light of the above-described problems, and is aimed to establish a new technique of zinc oxide electrodeposition method, which reduces the cost, and to stably provide an excellent mass-producible, high-performance and low-cost substrate with zinc oxide electrodeposited thereon, which has an excellent adhesion property between the substrate and zinc oxide, and to contribute to full-scale proliferation of solar-electric power generation by incorporating the substrate with zinc oxide electrodeposited thereon into a photovoltaic device.

In order to accomplish the above-described object, concerning technique for forming a zinc oxide film having texture shape which has high light confinement effect on a conductive substrate, and further technique for improving the adhesion and film uniformity, the present inventors have reached the present invention having the following structure as a result of effortful researches.

(1) In a method for forming a zinc oxide film on a conductive substrate, which comprises dipping a conductive substrate and a counter electrode in an aqueous solution containing at least nitric acid ion and zinc ion and supplying a current between the conductive substrate and the counter electrode, wherein the aqueous solution further contains polycarboxylic acid in which a carboxyl radical is bonded to a plurality of carbons having sp2 hybrid orbital, or its ester, and wherein a concentration of the polycarboxyllc acid is set to 0.5 $\mu$mol/L to 500 $\mu$mol/L. Thereby, it is possible to deposit, with good efficiency, zinc oxide having texture structure excellent in optical confinement effect. In this respect, the carboxylic acid in the present specification also includes ionized carboxylic acid.

(2) As the above-described aqueous solution, there is used an aqueous solution containing at least nitric acid ion, zinc ion and polycarboxylic acid in which a carboxylic radical is bonded to each of adjacent carbons having sp2 hybrid orbital, or its ester. Thereby, it is possible to deposit, with good efficiency, zinc oxide having texture structure excellent in more effectively optical confinement affect.

(3) As polycarboxylic acid in which the carboxyl radicals are bonded to a plurality of carbon having the above-described sp2 hybrid orbital, or its ester, phthalic acid or its ester is used. Thereby, it is possible to deposit, with good efficiency, zinc oxide having texture structure excellent in more effectively optical confinement effect.

(4) The above-described zinc ion concentration is set to 0.05 mol/L or more. Thereby, it is possible to deposit zinc oxide, with good efficiency, having texture structure excellent in more effectively optical confinement effect.

(5) As the above-described aqueous solution, an aqueous solution containing saccharose or dextrin is used. Thereby, it is possible to deposit a zinc oxide film having excellent adhesion and less abnormal growth for many hours with good efficiency.

(6) As the above-described conductive substrate, a conductive substrate having a zinc oxide film deposited thereon in advance is used. Thereby, it is possible to deposit a zinc oxide film having excellent adhesion and less abnormal growth with good efficiency. Also, the crystallizability of the zinc oxide film which is deposited in advance is controlled (electrodeposition on a zinc oxide film having high or enlarged crystallizability can make the crystal grain size larger, or in the opposition case, the crystal grain size is made smaller, and as a factor affecting the crystallizability, there are, for example, film formation temperature, film formation rate, film thickness and the like), whereby it is possible to deposit, with good efficiency, zinc oxide having texture structure excellent in more effectively optical confinement effect.

(7) In a process for producing a photovoltaic device comprising a zinc oxide film, the zinc oxide film is formed by the above-described method and a semiconductor layer is further formed thereon. Thereby, it is possible to provide a photovoltaic device with high quality (excellent in short-circuit current, conversion efficiency, and adhesion) and low power cost.

As described above, according to the present invention, it is possible to form a zinc oxide film having high optical confinement effect, which is useful to improve the solar cell characteristics, and high reliability at low cost with stability for industrial use, and this contributes to improvement in current collection efficiency and reliability of the photovoltaic device.

DETAILED DESCRIPTION OF THE PREFERRED EMBODIMENTS

Next, with reference to the accompanying drawings, the embodiments according to the present invention will be described below.

<Forming Method of Zinc Oxide Film Using Electrodeposition>

Figure 1:
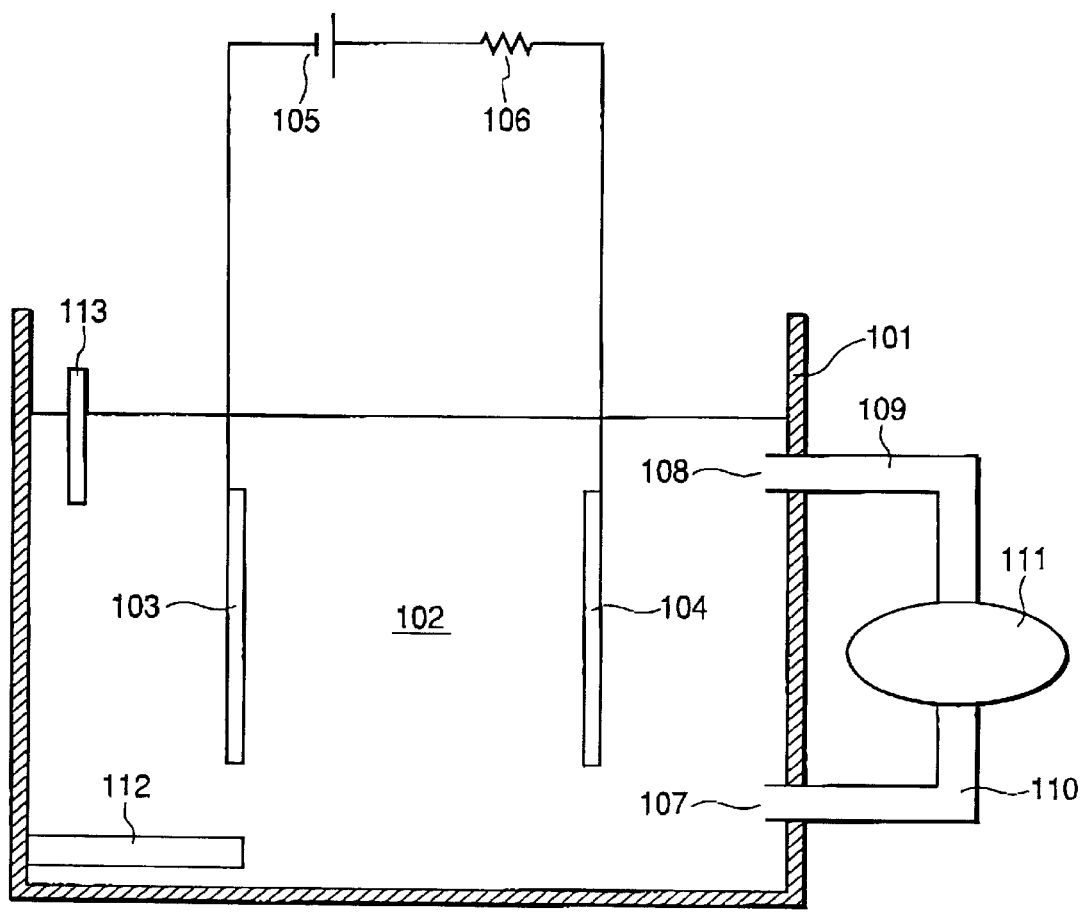
FIG. 1 is a schematic view showing an example of an apparatus for depositing zinc oxide from an aqueous solution to which the present invention is applicable.

FIG. 1 is a block diagram showing a manufacturing apparatus for performing electrodeposition for forming a zinc oxide film. In FIG. 1, a reference numeral 101 denotes a corrosion-resistant container; 102, an aqueous solution; 103, a conductive substrate; 104, a counter electrode; 105, power supply; 106, a load resistance; 107, a solution injection port; 108, a solution suction port; 109, a solution intake pipe; 110, a solution injection pipe; 111, a solution circulating pump; and 112, a heater.

An electrodeposition aqueous solution 102 is an aqueous solution containing at least nitric acid ion and zinc ion, and concentrations of these nitric acid ion and zinc ion are preferably 0.002 mol/L to 3.0 mol/L, more preferably 0.01 mol/L to 1.5 mol/L, and further preferably 0.05 mol/L to 0.7 mol/L.

Examples of polycarboxylic acid in which a carboxyl radical is bonded to a plurality of carbon having the sp2 hybrid orbital to be added to the electrodeposition aqueous solution 102 according to the present invention, or its ester includes compounds having —C=C— group in which carboxyl group or ester group is bonded to each of these carbons, or compounds in which carboxyl radical or ester radical is bonded to a plurality of carbons of an aromatic ring (such as a benzene ring or an aromatic heterocyclic ring). More concretely, phthalic acid, isophthalic acid, maleic acid, naphthalic acid or their esters and the like are included. The concentrations of these polycarboxylic acid are preferably set to 0.5 μmol/L to 500 μmol/L, more preferably 50 μmol/L to 500 μmol/L, and further preferably 150 μmol/L to 500 μmol/L. The concentration of the polycarboxylic acid is controlled in this manner, whereby it is possible to form, with good efficiency, a zinc oxide film having texture structure suitable for the optical confinement effect.

Although the details are not clear, the prevent inventors have presumed that particularly the structure of

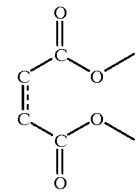

greatly contributes to growth process of zinc oxide crystal. (Notes: C===C represents bonding between sp2 carbons.)

Figure 5A:
FIGS. 5A, 5B and 5C are SEM photographs showing a zinc oxide thin film obtained by electrodeposition according to the present invention.
Figure 5B:
Figure 5C:
Figure 6:
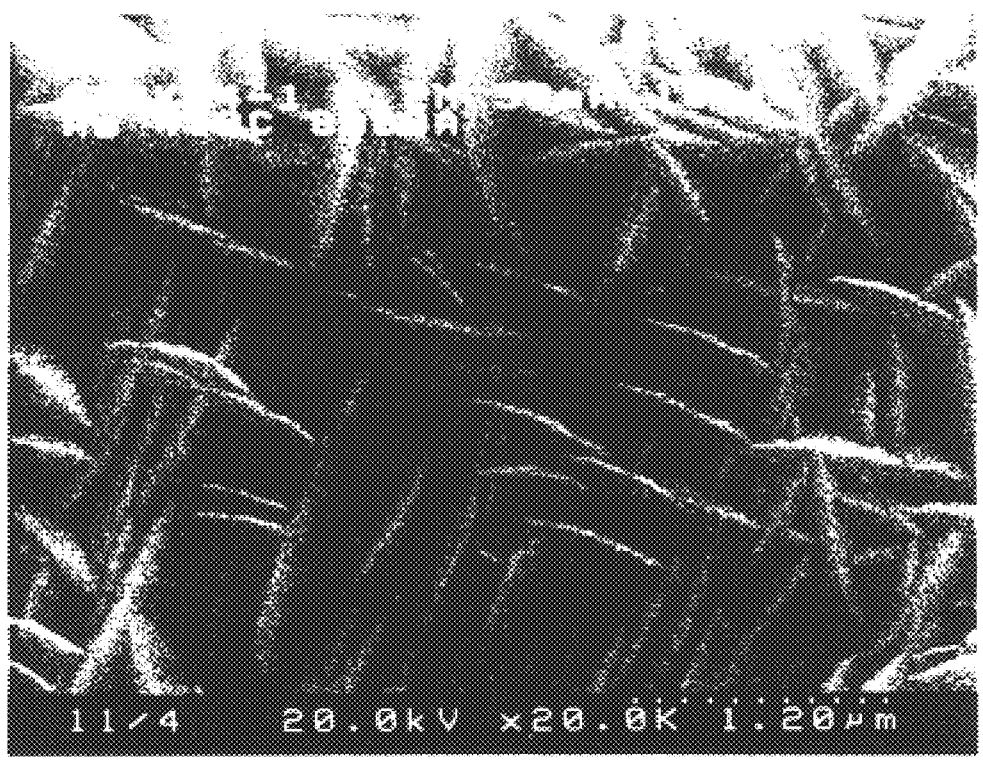
FIG. 6 is a SEM photograph showing a zinc oxide thin film obtained in the prior art.

In this respect, FIGS. 5A to 5C shows SEM photographs of a zinc oxide film according to the present invention, obtained by producing with an amount of addition of phthalic acid as 10 μmol/L. 70 μmol/L, and 100 μmol/L, and FIG. 6 shows a SEM photograph of a zinc oxide film according to the prior art.

Also, when saccharose or dextrin is contained in the aqueous solution 102, it is possible to restrain abnormal growth of the zinc oxide film because these admixtures can act to make the electrodeposition reaction appropriate, thus making it possible to make excellent the uniformity and adhesion of a surface where a film is formed. By doing so, it is possible to form the zinc oxide film having the texture structure having high optical confinement effect with a good yield. Also, when saccharose or dextrin is added to the aqueous solution 102, the concentration of saccharose is preferably set to 1 g/L to 500 g/L, and further preferably 3 g/L to 100 g/L, and the dextrin concentration is preferably set to 0.01 g/L to 10 g/L, and further preferably 0.025 g/L to 1 g/L.

The conductive substrate 103 and the counter electrode 104 are connected to the power supply 105 through the load resistance 106. A current value supplied between the conductive substrate 103 and the counter electrode 104 is preferably 0.1 mA/cm to 100 MA/cm$^2$, further preferably 1 mA/cm$^2$ to 30 mA/cm$^2$, and optimally 4 mA/cm$^2$ to 20 mA/cm$^2$.

Also, pH in the bath is set to 3 or more, the electric conductivity is set to 10 mS/cm or more, and the solution temperature is set to 60° C. or more, whereby an uniform zinc oxide film having less abnormal growth can be formed with good efficiency in order to stir the solution as a whole, there is used a solution circulating system composed of the solution suction port 108, the solution injection port 107, the solution circulating pump 111, the solution suction pipe 109 and the solution injection pipe 110. For a small-scale apparatus, a magnetic stirrer can be used.

The texture structure of the zinc oxide film to be formed according to the present invention can be evaluated in terms of the following measurement items.

(Inclination Angle Θ)

An inclination angle Θ is an average value of an angle between the surface of zinc oxide and a main surface of the substrate. In this case, the main surface is a virtual plane obtained by removing irregularities which have inherently existed on the substrate surface, and accordingly has a positive correlation with an irregular reflection factor. The larger (90° or less) its value is, the more it contributes to improvement of the efficiency of the solar cell. In other words, it comes to have texture structure which is effective for the optical confinement effect. The inclination angle Θ can concretely be determined by arctan (df/dx)(where dx is a sampling length, and df is a variation amount of a distance between the surface of the zinc oxide layer and the main surface of the substrate).

(Surface Roughness Ra)

For regards solar cell characteristics, when surface roughness Ra is excessively increased, series resistance Rs increases and FF decreases. At this point in time, within a range of Ra being 10 nm to 120 nm, the effect of the solar cell characteristics by the optical confinement of the texture structure according to the present invention has been confirmed.

(Grain Size)

Grain size is an average value of distance between surface peaks (between valleys) of zinc oxide. For solar cell characteristics, at this point in time, at 10 nm to 150 nm, the effect of the solar cell characteristics by the optical confinement of the texture structure according to the present invention has been confirmed.

<Photovoltaic Device>

Figure 2:
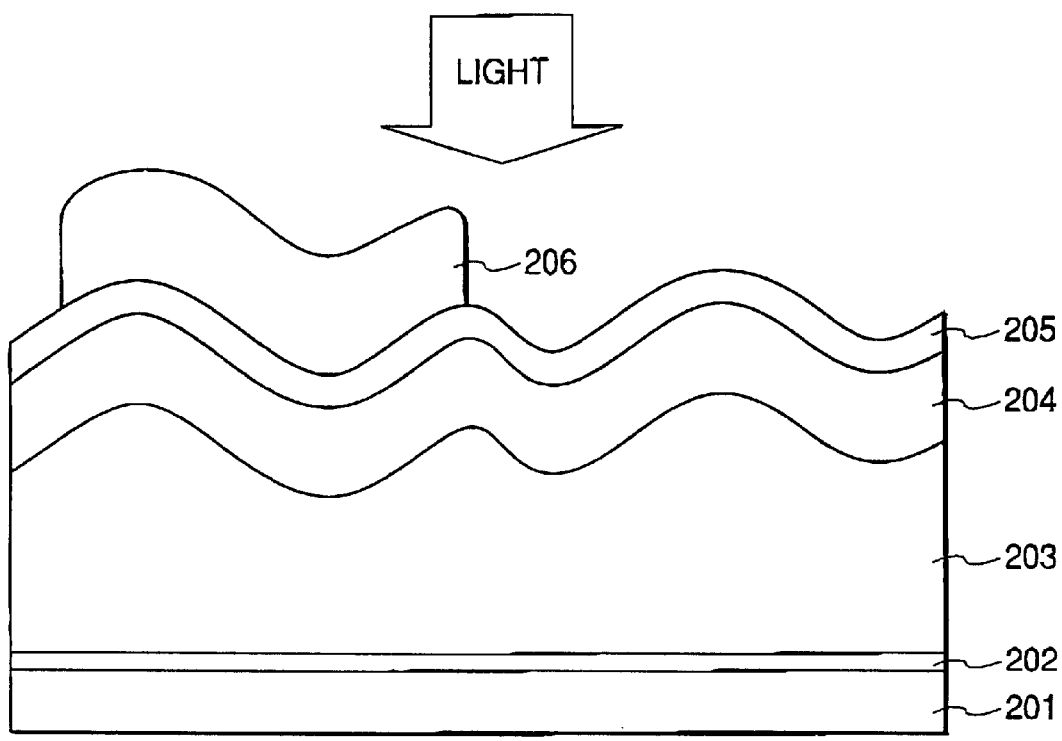
FIG. 2 is a partial cross-sectional view schematically showing an example of a photovoltaic device according to the present invention.

FIG. 2 is a cross-sectional view showing a stacked structure of a photovoltaic device according to the present invention. The device shown in FIG. 2 is a solar cell, and in FIG. 2, a reference numeral 201 denotes a substrate (support member); 202, a metal layer (back reflection layer); 203, a zinc oxide layer (transparent conductive layer) made of hexagonal system polycrystal; 204, a semiconductor layer; 205, a transparent electrode layer: and 206 is a current collection electrode. In this respect, in the case of structure in which light is incident from the transparent substrate side, each layer is formed in the reverse order with respect to the above-described order except for the substrate.

Next, the other components of the present invention will be described below.

(Substrate)

For the substrate 201, there are used a substrate made of a metal, or resin, glass, ceramic and the like which are coated with a conductive material. On the surface thereof, it may have micro-texture. Structure in which light is incident from the substrate side may be adopted by using a transparent substrate. Also, use of a substrate such as stainless steel and polyimide having flexibility makes it possible to take a long shape and correspond to continuous film formation.

(Metal Layer)

The metal layer 202 has two roles: one role acting as an electrode, and the other role acting as a reflecting layer by reflected light reached the substrate 201 to re-use it in the semiconductor layer. Al, Cu, Ag, Au and the like are formed by means of a method such as vapor deposition, sputtering, electrodeposition and printing. By having the texture on the surface thereof, it is possible to extend the optical path length of reflected light within the semiconductor layer and to increase short-circuit current. If the substrate has electric conductivity, the metal layer does not have to be formed.

(Transparent Conductive Layer)

The transparent conductive layer 203 increases irregular reflection of incident light and reflected light, and extends the optical path length within the semiconductor layer. Also, the transparent conductive layer prevents generation of diffusion or migration of the elements of the metal layer 202 into the semiconductor layer 204 which results in the shunting of the photovoltaic device. Further, the transparent conductive layer having moderate resistance can prevent a short circuit due to failure such as pinholes in the semiconductor layer. Further, it is preferable that the transparent conductive layer has texture effective for the optical confinement effect on its surface as in the case of the metal layer.

(Semiconductor Layer)

For the material for the semiconductor layer 204, there are used amorphous or microcrystalline St, C, Ge or their alloys. At the same time, hydrogen and/or halogen atoms are contained. Its preferable content is 0.1 to 40 atomic %. Further it may contain oxygen, nitrogen or the like. These impurity concentration is preferably $5\times10^{19}$ cm$^{-3}$ or less. Further, in order to make the semiconductor layer into a p-type semiconductor, a III-group element is contained, and in order to make it into an n-type semiconductor, a V-group element is contained.

In the case of a stacked cell, it is preferable that an i-type semiconductor layer having pin junction near the light incidence side has a wide bandgap and as the pin junction is kept apart therefrom, the bandgap becomes narrower. Also, within the i-type semiconductor layer, a minimum value of the bandgap is preferably near the p-type semiconductor layer rather than the center of the film thickness.

For a doped layer on the light incidence side, a crystalline semiconductor having less photoabsorption or a semiconductor having a wide bandgap is suitable.

In order to form the semiconductor layer, a microwave (MW) plasma CVD method or a high-frequency (RF) CVD method is suitable.

For this semiconductor deposition technique, "i-layer made of Graded SiGe having Ge composition of 20 to 70 atomic %" (Japanese Patent Application Laid-Open No. 6-21494 or the like can be used.

(Transparent Electrode Layer)

The transparent electrode layer 205 also can act as an antireflection film by appropriately setting the film thickness. The transparent electrode layer is formed of a material such as ITO, ZnO and In$_2$O$_3$ by means of a method such as vapor deposition, CVD, spray, spinon and dipping. These chemical compounds may contain a substance for changing their conductivities.

(Current Collection Electrode)

The current collection electrode 206 is provided in order to enhance the current collection efficiency. As its forming method, there are a method for forming a metal of current collecting pattern by sputtering using a mask, a method for printing a conductive paste or a soldering paste, a method for fixing a metal wire with a conductive paste, and the like.

Incidentally, as occasion arises, protective layers may be formed on both surfaces of the photovoltaic device. At the same time, a reinforcing material such as a steel plate may be used together.

Hereinafter, examples according to the present invention will be described below. The present invention is not limited to these examples.

EXAMPLE 1

For an experiment, the apparatus shown in FIG. 1 was used. As the negative electrode (conductive substrate) 103, stainless steel 430BA with thickness of 0.12 mm, on which copper was sputtered by 200 nm in thickness, was used, and its back surface was covered with a tape. As the positive electrode (counter electrode) 104, zinc of 4-N with thickness of 1 mm was used. As the aqueous solution 102, 60% nitric acid (specific gravity 1.38) of 5.5 cc was added to zinc acetate aqueous solution of 0.25 mol/L at 85° C., and potassium hydrogen phthalate was further added to the solution so as to adjust the potassium hydrogen phthalate concentration to 100 μmol/L, thereby preparing the aqueous solution. As the applied current, 4.0 mA/cm$^2$ (0.4 A/dm$^2$) was used, and the current was supplied for ten minutes.

For a zinc oxide thin film obtained on the substrate 103 at the negative electrode side, the total reflection factor and irregular reflection factor at wavelength of 800 nm were measured (JASCO V-570). Next, by using an atomic force microscope (Quesant CO. Qscope Model 250), an inclination angle Θ, surface roughness Ra and grain size were measured based on an average angle of a movement of a needle point (and normally, such a measurement mode has been set with the atomic force microscope). The results of the above-described points are shown in Table 1.

EXAMPLE 2

60% nitric acid (specific gravity 1.38) of 5.5 cc was added to 0.25 mol/L zinc acetate aqueous solution at 85° C., and ammonium phthalate was further added to the aqueous solution so as to adjust the ammonium phthalate concentration to 100 μmol/L. Resides the foregoing, the electrodeposition was performed in the same manner as in the case of Example 1.

For a zinc oxide thin film obtained on the substrate 103 at the negative electrode side, the total reflection factor and irregular reflection factor at wavelength of 800 nm were measured (JASCO V-570). Next, by using an atomic force microscope (Quesant Co. Qscope Model 250), an inclination angle Θ, surface roughness Ra and grain size were measured based on an average angle of the movement of a needle point. The results of the above-described points are shown in Table 1.

EXAMPLE 3

60% nitric acid (specific gravity 1.38) of 5.5 cc was added to 0.25 mol/L zinc acetate aqueous solution at 85° C., and diethyl phthalate was further added to the aqueous solution so as to adjust the diethyl phthalate concentration to 100 μmol/L. Besides the foregoing, the electrodeposition was performed in the same manner as in the case of Example 1.

For a zinc oxide thin film obtained on the substrate 103 on the negative electrode side, the total reflection factor and irregular reflection factor at wavelength of 800 nm were measured (JASCO V-570). Next, by using an atomic force microscope (Quesant CO. Qscope Model 250), an inclination angle Θ, surface roughness Ra and grain size were measured based on an average angle of the movement of a needle point. The results of the above-described points are shown in Table 1.

EXAMPLE 4

60% nitric acid (specific gravity 1.38) of 5.5 cc was added to 0.25 mol/L zinc acetate aqueous solution at 85° C., and maleic acid was further added to the aqueous solution so as to adjust the maleic acid concentration to 100 μmol/L. Besides the foregoing, the electrodeposition was performed in the same manner as in the case of Example 1.

For a zinc oxide thin film obtained on the substrate 103 at the negative electrode side, the total reflection factor and irregular reflection factor at wave length of 800 nm were measured (JASCO V-570). Next, by using an atomic force microscope (Quesant CO. Qscope Model 250), an inclination angle Θ, surface roughness Ra and grain size were measured based on an average angle of the movement of a needle point. The results of the above-described points are shown in Table 1.

COMPARATIVE EXAMPLE 1

Except that 60% nitric acid (specific gravity 1.38) of 5.5 cc was added to 0.25 mol/L acetate aqueous solution at 85° C., the electrodeposition was performed in the same manner as in the case of Example 1.

For a zinc oxide thin film obtained on the substrate 103 at the negative electrode side, the total reflection factor and irregular reflection factor at wavelength of 800 nm were measured (JASCO V-570). Next, by using an atomic force microscope (Quesant CO. Qscope Model 250), an inclination angle Θ, surface roughness Ra and grain size were measured based on an average angle of a movement of a needle point. The results of the above-described points are shown in Table 1.

TABLE 1

|  | Example 1 | Example 2 | Example 3 | Example 4 | Comparative Example 1 |
|---|---|---|---|---|---|
| Total reflection factor (%) | 85 | 83 | 84 | 84 | 84 |
| Irregular reflection factor (%) | 80 | 80 | 78 | 70 | 55 |
| Inclination angle θ (°) (Relative comparison with Comparative Example 1) | 1.5 | 1.6 | 1.5 | 1.3 | 1 |
| Surface roughness Ra (nm) | 70 | 74 | 72 | 65 | 45 |
| Grain size (μm) | 0.60 | 0.59 | 0.61 | 0.57 | 0.55 |

From Table 1, the following can be said. The addition of the aqueous solution containing polycarboxylic acid in which a carboxyl radical is bonded to each of carbons having a sp2 hybrid orbital increases the irregular reflection factor and the inclination angle Θ. Particularly, the addition of an aqueous solution containing polycarboxylic acid in which a carboxyl radical is attached to each of adjacent carbon having the sp2 hybrid orbital, or its ester increases the inclination angle Θ. Of these, effects (of increasing the irregular reflection factor and the inclination angle Θ) by the addition of phthalic acid and phthalate diester are exceedingly great.

EXAMPLE 5

For an experiment, the apparatus shown in FIG. 1 was used. For the negative electrode (conductive substrate) 103, stainless steel 430BA with thickness of 0.12 mm, on which silver was sputtered by 800 nm in thickness, was used, and its back surface was covered with a tape. For the positive electrode (counter electrode) 104, zinc of 4-N with thickness of 1 mm was used. For the aqueous solution 102, a 0.2 mol/L zinc nitrate aqueous solution at 75° C. was used, and the concentration of potassium hydrogen phthalate was changed from 0.1 μmol/L to 0.5 μmol/L, 50 μmol/L, 150 μmol/L, 300 μmol/L, 500 μmol/L, 800 μmol/L and 1000 μmol/L and electrodeposition was carried out, respectively. For the applied current at this time, 8.0 mA/cm² (0.8 A/dm²) was used, and the current was supplied for five minutes.

For respective zinc oxide thin films obtained on the substrate 103 at the negative electrode side, the total reflection factor and irregular reflection factor at wavelength of 800 nm were measured (JASCO V-570). Next, by using an atomic force microscope (Quesant CO. Qscope Model 250), an inclination angle Θ, surface roughness Ra, grain size and surface area were measured based on an average angle of a movement of a needle point. The results of the above-described points are shown in Table 2.

COMPARATIVE EXAMPLE 2

Except that as the aqueous solution, 0.2 mol/L zinc nitrate aqueous solution at 75° C. was used, the electrodeposition was performed in the same manner as in the case of Example 5.

For respective zinc oxide thin films obtained on the substrate 103 at the negative electrode side, the total reflection factor and irregular reflection factor at wavelength of 800 nm were measured (JASCO V-570). Next, by using an atomic force microscope (Quesant CO. Qscope Model 250), an inclination angle 9, surface roughness Ra, grain size and surface area were measured based on an average angle of the movement of a needle point. The results of the above-described points are shown in Table 2.

the sp2 hybrid orbital, or its ester increases the irregular reflection factor and the inclination angle Θ. Particularly, within a range of the amount of addition of 0.5 μmol/L to 500 μmol/L, without lowering the total reflection factor, the irregular reflection factor and inclination angle Θ increase while a magnitude increase in the surface roughness Ra and the grain size is restrained. Particularly, the Table 2 reveals that the addition amount of 50 μmol/L to 500 μmol/L, among others, 150 μmol/L to 500 μmol/L are preferable. Since it is considered that such a change results from the structure of

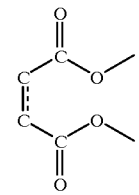

as described above, the preferable range of the addition amount is applicable to not only potassium hydrogen phthalate but also other polycarboxylic acid or its ester.

EXAMPLE 6

For an experiment, the apparatus shown in FIG. 1 was used. For the negative electrode (conductive substrate) 103, stainless steel 430BA with thickness of 0.12 mm was used, and its back surface was covered with a tape. For the positive electrode (counter electrode) 104, zinc of 4-N with thickness of 1 mm was used. The aqueous solution 102 was maintained at 80° C., maleic acid concentration was 100 μmol/L, zinc nitrate concentration was changed from 0.03 mol/L to 0.05 mol/L, 0.1 mol/L, 0.2 mol/L and 0.3 mol/L and electrodeposition was carried out, respectively. For the applied current at this time, 5.0 mA/cm² (0.5 A/dm²) was used, and the current was supplied for five minutes.

For respective zinc oxide thin films obtained on the substrate 103 at the negative electrode side, the total reflection factor and irregular reflection factor at wavelength of 800 nm were measured (JASCO V-570). Next, by using an atomic force microscope (Quesant CO. Qscope Model 250), an inclination angle Θ, surface roughness Ra, grain size and

TABLE 2

|  | Example 5 |  |  |  |  |  |  |  | Comparative Example 2 |
|---|---|---|---|---|---|---|---|---|---|
| Phthalic acid concentration (μmol/L) | 0.1 | 0.5 | 50 | 150 | 300 | 500 | 800 | 1000 | 0 |
| Total reflection factor (%) | 92 | 92 | 93 | 92 | 91 | 92 | 83 | 83 | 92 |
| Irregular reflection factor (%) | 63 | 75 | 80 | 88 | 88 | 87 | 83 | 83 | 61 |
| Inclination angle θ (°) (Relative comparison with Comparative Example 2) | 1.03 | 1.2 | 1.3 | 1.6 | 1.5 | 1.6 | 1.6 | 1.6 | 1 |
| Surface roughness Ra(nm) | 50 | 55 | 61 | 65 | 72 | 80 | 115 | 110 | 50 |
| Grain size (μm) | 0.51 | 0.53 | 0.58 | 0.59 | 0.60 | 0.62 | 0.65 | 0.65 | 0.51 |

From Table 2, the following can be said. The addition of the aqueous solution containing polycarboxylic acid in which a carboxyl radical is bonded to each of carbon having surface area were measured based on an average angle of the movement of a needle point. The results of the above-described points are shown in Table 3.

COMPARATIVE EXAMPLE 3

Except that no maleic acid was added to the aqueous solution 102, electrodeposition was carried out in the same manner as in the case of Example 6. In Comparative Example 3, zinc nitrate concentration was also changed from 0.03 mol/L to 0.05 mol/L, 0.1 mol/L, 0.2 mol/L and 0.3 mol/L and electrodeposition was carried out, respectively. For the applied current at this time, 5.0 mA/cm$^2$ (0.5 A/dm$^2$) was used, and the current was supplied for five minutes.

For respective zinc oxide thin films obtained on the substrate 103 at the negative electrode side, the total reflection factor and irregular reflection factor at wavelength of 800 nm were measured (JASCO V-570). Next, by using an atomic force microscope (Quesant CO. Qscope Model 250), an inclination angle Θ, surface roughness Ra, grain size and surface area were measured based on an average angle of the movement of a needle point. The results of the above-described points are shown in Table 3.

TABLE 3

|  | Example 6 |  |  |  |  | Comparative Example 3 |  |  |  |  |
|---|---|---|---|---|---|---|---|---|---|---|
| Zinc nitrate concentration (mol/L) | 0.03 | 0.05 | 0.1 | 0.2 | 0.3 | 0.03 | 0.05 | 0.1 | 0.2 | 0.3 |
| Total reflection factor (%) | 40 | 39 | 40 | 41 | 40 | 40 | 40 | 41 | 40 | 40 |
| Irregular reflection factor (%) | 6 | 24 | 27 | 31 | 33 | 5 | 12 | 17 | 19 | 20 |
| Inclination angle θ (°) (Relative comparison to respective zinc nitrate concentrations of Comparative Example 3) | 1.03 | 1.15 | 1.3 | 1.35 | 1.35 | 1 | 1 | 1 | 1 | 1 |
| Surface roughness Ra(nm) | 7 | 55 | 63 | 70 | 85 | 6 | 25 | 30 | 40 | 50 |
| Grain size (μm) | 0.12 | 0.47 | 0.53 | 0.59 | 0.62 | 0.11 | 0.42 | 0.46 | 0.51 | 0.58 |

From Table 3, the following can be said. The addition of the aqueous solution containing polycarboxylic acid in which a carboxyl radical is bonded to each of carbon having the sp2 hybrid orbital increases the irregular reflection factor and the angle of inclination Θ, particularly, in zinc nitrate concentration of 0.05 mol/L or more, the rate of increasing the irregular reflection factor and the inclination angle Θ is high, thereby providing remarkable effects.

EXAMPLE 7

For the experiment, the apparatus shown in FIG. 1 was used. As the negative electrode (conductive substrate) 103, stainless steel 430BA with thickness of 0.12 mm, on which silver was sputtered by 400 nm in thickness, was used, and its back surface was covered with a tape. As the positive electrode (counter electrode) 104, zinc of 4-N with thickness of 1 mm was used. As the aqueous solution, potassium hydrogen phthalate was added to 0.15 mol/L zinc nitrate aqueous solution at 90° C. so as to adjust the potassium hydrogen phthalate concentration to 200 μmol/L. As the applied current, 6.0 mA/cm$^2$ (0.6 A/dm$^2$) was used, and the current was supplied for ten minutes.

The total reflection factor and irregular reflection factor (JASCO V-570) at wavelength of 800 nm of a zinc oxide thin film obtained on the substrate 103 at the negative electrode side, were measured. Next, by using an atomic force microscope (Quesant CO. Qscope Model 250), an inclination angle Θ, surface roughness Ra and grain size were measured based on an average angle of the movement of a needle point. Next, the number of abnormal growth was measured by visual inspection (range of 3 cm×3 cm). Further, by means of SEM observation (Hitachi, Ltd. S-4500), the number of abnormal growth was counted within a range of 10 mm×10 mm. Further, this sample was left standing under environment at temperature of 85° C. and humidity of 85% for 1000 hours and a peeling test was carried out in accordance with the lattice pattern tape method (JIS K5400 8.5.2). The results of the above-described points are shown in Table 4.

EXAMPLE 8

As the aqueous solution, potassium hydrogen phthalate was added to 0.15 mol/L zinc nitrate aqueous solution at 90° C. so as to adjust the potassium hydrogen phthalate concentration to 200 μmol/L, and further saccharose of 12 g/L was added thereto. Beside the foregoing, the electrodeposition was performed in the same manner as in the case of Example 7.

The total reflection factor and irregular reflection factor (JASCO V-570) at wavelength of 800 nm of a zinc oxide thin film obtained on the substrate 103 at the negative electrode side were measured. Next, by using an atomic force microscope (Quesant CO. Qscope Model 250), an inclination angle Θ, surface roughness Ra and grain size were measured based on an average angle of the movement of a needle point. Next, the number of abnormal growth was measured by visual inspection (range of 3 cm×3 cm). Further, by means of SEM observation (Hitachi, Ltd. S-4500), the number of abnormal growth was counted within a range of 10 mm×10 mm. Further, this sample was left standing under environment at temperature of 85° C. and humidity of 85% for 1000 hours and a peeling test was carried out in accordance with the lattice pattern tape method (JIS K5400 8.5.2). The results of the above-described points are shown in Table 4.

EXAMPLE 9

As the aqueous solution, potassium hydrogen phthalate was added to 0.15 mol/L zinc nitrate aqueous solution at 90° C. so as to adjust the potassium hydrogen phthalate concentration to 200 μmol/L, and further dextrin of 0.1 g/L was added thereto. Beside the foregoing, the electrodeposition was performed in the same manner as in the case of Example 7.

The total reflection factor and irregular reflection factor (JASCO V-570) at wavelength of 800 nm of a zinc oxide thin film obtained on the substrate 103 on the negative electrode side, were measured. Next, by using an atomic force microscope (Quesant CO. Qscope Model 250), an inclination angle Θ, surface roughness Ra and grain size were measured based on an average angle of the movement of a needle point. Next, the number of abnormal growth was measured by visual inspection (range of 3 cm×3 cm). Further, by means of SEM observation (Hitachi, Ltd. S-4500), the number of abnormal growth was counted within a range of 10 mm×10 mm. Further, this sample was left standing under environment at temperature of 85° C. and humidity of 85% for 1000 hours and a peeling test was carried out in accordance with the lattice pattern tape method (JIS K5400 8.5.2). The results of the above-described points are shown in Table 4.

EXAMPLE 10

As the aqueous solution, potassium hydrogen phthalate was added to 0.15 mol/L zinc nitrate aqueous solution at 90° C. so as to adjust the potassium hydrogen phthalate concentration to 200 μmol/L, and further dextrin of 0.1 g/L was added thereto. As the negative substrate 103, there was used a substrate obtained by sputtering silver on a 0.12 mm thick stainless steel 430BA by 400 nm in thickness, and further sputtering ZnO thereon by 200 nm in thickness (film formation rate of 2 nm/sec at substrate temperature of 100° C.). Beside the foregoing, the electrodeposition was performed in the same manner as in the case of Example 7.

The total reflection factor and irregular reflection factor (JASCO V-570) at wavelength of 800 nm of a zinc oxide thin film obtained on the substrate 103 at the negative electrode side were measured. Next, by using an atomic force microscope (Quesant CO. Qscope Model 250), an inclination angle Θ, surface roughness Ra and grain size were measured based on an average angle of the movement of a needle point. Next, the number of abnormal growth was measured by visual inspection (range of 3 cm×3 cm). Further, by means of SEM observation (Hitachi, Ltd. S-4500), the number of abnormal growth was counted within a range of 10 mm×10 mm. Further, this sample was left standing under environment at temperature of 85° C. and humidity of 85% for 1000 hours and a peeling test was carried out in accordance with the lattice pattern tape method (JIS K5400 8.5.2). The results of the above-described points are shown in Table 4.

EXAMPLE 11

As the aqueous solution, potassium hydrogen phthalate was added to 0.15 mol/L zinc nitrate aqueous solution at 90° C. so as to adjust the potassium hydrogen phthalate concentration to 200 μmol/L, and further dextrin of 0.1 g/L was added thereto. As the negative substrate 103, there was used a substrate obtained by sputtering silver on a 0.12 mm thick stainless steel 430BA by 400 nm in thickness, and further sputtering ZnO thereon by 200 nm in thickness (film formation rate of 2 nm/sec at substrate temperature of 300° C.). Beside the foregoing, the electrodeposition was performed in the same manner as in the case of Example 7.

The total reflection factor and irregular reflection factor (JASCO V-570) at wavelength of 800 nm of a zinc oxide thin film obtained on the substrate 103 at the negative electrode side were measured. Next, by using an atomic force microscope (Quesant CO. Oscope Model 250), an inclination angle Θ, surface roughness Ra and grain size were measured based on an average angle of the movement of a needle point. Next, the number of abnormal growth was measured by visual inspection (range of 3 cm×3 cm). Further, by means of SEM observation (Hitachi, Ltd. S-4500), the number of abnormal growth was counted within a range of 10 mm×10 mm. Further, this sample was left standing under environment at temperature of 85° C. and humidity of 85% for 1000 hours and a peeling test was carried out in accordance with the lattice pattern tape method (JIS K5400 8.5.2). The results of the above-described points are shown in Table 4.

EXAMPLE 12

As the aqueous solution, potassium hydrogen phthalate was added to 0.15 mol/L zinc nitrate aqueous solution at 90° C. so as to adjust the potassium hydrogen phthalate concentration to 200 μmol/L, and further dextrin of 0.1 g/L was added thereto. As the negative substrate 103, there was used a substrate obtained by sputtering silver on a 0.12 mm thick stainless steel 430BA by 400 nm in thickness, and further sputtering ZnO thereon by 200 nm in thickness (film formation rate of 10 nm/sec at substrate temperature of 300° C.). Beside the foregoing, the electrodeposition was performed in the same manner as in the case of Example 7.

The total reflection factor and irregular reflection factor (JASCO V-570) at wavelength of 800 nm of a zinc oxide thin film obtained on the substrate 103 at the negative electrode side were measured. Next, by using an atomic force microscope (Quesant CO Qscope Model 250), an inclination angle Θ, surface roughness Ra and grain size were measured based on an average angle of the movement of a needle point. Next, the number of abnormal growth was measured by visual inspection (range of 3 cm×3 cm). Further, by means of SEM observation (Hitachi, Ltd. S-4500), the number of abnormal growth was counted within a range of 10 mm×10 mm. Further, this sample was left standing under environment at temperature of 85° C. and humidity of 85% for 1000 hours and a peeling test was carried out in accordance with the lattice pattern tape method (JIS K5400 8.5.2). The results of the above-described points are shown in Table 4.

TABLE 4

|  | Example 7 | Example 8 | Example 9 | Example 10 | Example 11 | Example 12 |
|---|---|---|---|---|---|---|
| Total reflection factor (%) | 91 | 91 | 91 | 90 | 91 | 91 |
| Irregular reflection factor (%) | 83 | 83 | 82 | 86 | 90 | 87 |
| Inclination angle Θ (°) (Relative comparison with Example 7) | 1 | 0.99 | 1.01 | 1.04 | 1.13 | 1.09 |

TABLE 4-continued

|  | Example 7 | Example 8 | Example 9 | Example 10 | Example 11 | Example 12 |
|---|---|---|---|---|---|---|
| Surface roughness Ra(nm) | 58 | 58 | 57 | 56 | 78 | 72 |
| Grain size (μm) | 0.45 | 0.45 | 0.45 | 0.45 | 0.68 | 0.64 |
| Visual observation (3 cm × 3 cm) | 120 | 0 | 0 | 0 | 0 | 0 |
| SEM observation (10 mm × 10 mm) | 1080 | 18 | 15 | 1 | 0 | 2 |
| Lattice pattern tape method | Six points Slightly peeled off | Eight points Slightly peeled off | Eight points Slightly peeled off | Ten points (full marks) Not peeled off | Ten points (full marks) Not peeled off | Ten points (full marks) Not peeled off |

From Table 4, the following can be said. Concurrently with the addition of the polycarboxylic acid in which a carboxyl radical is bonded to each of carbon having the sp2 hybrid orbital, or its ester, the addition of saccharose or dextrin makes it possible to decrease the abnormal growth in a large amount and enhance the adhesion of the zinc oxide film.

The surface of a substrate to be electrodeposition is made into a layer of ZnO, whereby it is possible to further enhance the adhesion of the zinc oxide thin film. In addition, the irregular reflection factor and the inclination angle can be further enhanced. In other words, by adjusting the ZnO layer on the surface of the substrate, the surface characteristics of the zinc oxide thin film can be controlled.

EXAMPLE 13

For the experiment, the apparatus shown in FIG. 1 was used. As the negative electrode (conductive substrate) 103, stainless steel 4302D with thickness of 0.12 mm, on which silver was sputtered by 200 nm in thickness, was used, and its back surface was covered with a tape. As the positive electrode (counter electrode) 104, zinc of 4-N with thickness of 1 mm was used. As the aqueous solution 102, 0.25 mol/L zinc nitrate aqueous solution at 85° C. was used, and potassium hydrogen phthalate was further added to the solution so as to adjust the potassium hydrogen phthalate concentration to 100 μmol/L. For the applied current, 4.0 mA/cm² (0.4 A/dm²) was used, and the current was supplied for ten minutes.

Thereafter, as the semiconductor layer, n-type amorphous silicon (a-Si), non-dope amorphous silicon (a-Si), and p-type microcrystalline silicon (μc-Si) were deposited by 20 nm, 200 nm and 14 nm in thickness, respectively, in this order by the CVD method. Further, ITO was deposited by 65 nm in thickness by heating vapor deposition under oxygen atmosphere to form a transparent conductive film as an upper electrode having an anti-reflection effect. Thereon, a grid made of silver was deposited by thermal vapor deposition to form an upper output electrode, thereby completing a photovoltaic device.

This photovoltaic device was measured under artificial sunlight to measure the short circuit current density and the conversion efficiency. Further, this device was left standing under environment of temperature of 85° C. and humidity of 85% for 1000 hours to measure a deterioration rate of conversion efficiency. The results of the above-described points are shown in Table 5.

EXAMPLE 14

As the aqueous solution, potassium hydrogen phthalate was added to 0.25 mol/L zinc nitrate aqueous solution at 85° C. so as to adjust the potassium hydrogen phthalate concentration to 100 μmol/L, and further dextrin of 0.1 g/L was added thereto to prepare the aqueous solution. Beside the foregoing, a zinc oxide film was formed in the same manner as in the case of Example 13 to produce a photovoltaic device.

This photovoltaic device was measured under artificial sunlight to measure the short circuit current density and the conversion efficiency. Further, this device was left standing under environment of temperature of 85° C. and humidity of 85% for 1000 hours (HH test) to measure a deterioration rate of conversion efficiency. The results of the above-described measurement are shown in Table 5.

EXAMPLE 15

As the aqueous solution, potassium hydrogen phthalate was added to 0.25 mol/L zinc nitrate aqueous solution at 85° C. so as to adjust the potassium hydrogen phthalate concentration to 100 μmol/L, and further dextrin of 0.1 g/L was added thereto. As the negative electrode 103, there was used a substrate obtained by sputtering silver by 200 nm in thickness on a 0.12 mm thick stainless steel 4302D, and further sputtering ZnO by 200 nm in thickness (film formation rate of 2 nm/sec at substrate temperature of 300° C.). Beside the foregoing, a zinc oxide film was formed in the same manner as in the case of Example 13 to produce a photovoltaic device.

This photovoltaic device was measured under artificial sunlight to measure the short circuit current density and the conversion efficiency. Further, this device was left standing under environment of temperature of 85° C. and humidity of 85% for 1000 hours to measure a deterioration rate of conversion efficiency. The results of the above-described measurement are shown in Table 5.

COMPARATIVE EXAMPLE 4

Except that no potassium hydrogen phthalate was added to the aqueous solution 102, a zinc oxide film was formed in the same manner as in the case of Example 13 to produce a photovoltaic device.

This photovoltaic device was measured under artificial sunlight to measure the short circuit current density and the conversion efficiency. Further, this device was left standing under environment of temperature of 85° C. and humidity of 85% for 1000 hours to measure a deterioration rate of conversion efficiency. The results of the above-described measurement are shown in Table 5.

TABLE 5

|  | Example 13 | Example 14 | Example 15 | Comparative Example 4 |
| --- | --- | --- | --- | --- |
| Short circuit current (%) (Relative comparison with Comparative Example 4) | 1.08 | 1.08 | 1.09 | 1 |
| Conversion efficiency (%) (Relative comparison with Comparative Example 4) | 1.03 | 1.04 | 1.08 | 1 |
| Deterioration rate of conversion efficiency (%) in HH test | 15 | 5 | 3 | 14 |

From Table 5, the following can be said. Use of a zinc oxide thin film formed in accordance with the present invention makes it possible to produce a photovoltaic device excellent in short circuit current, conversion efficiency and reliability.

EXAMPLE 16

Figure 3:
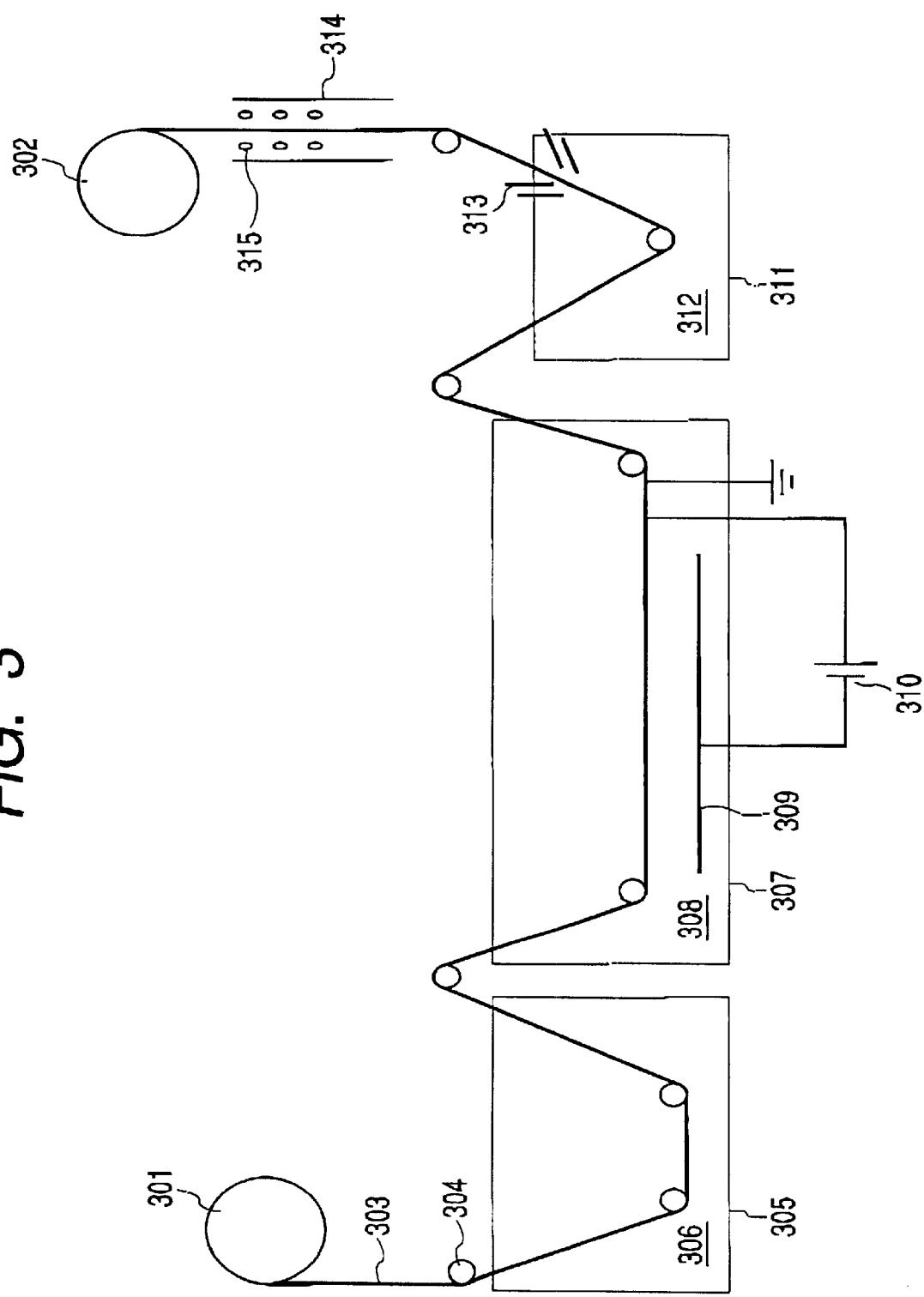
FIG. 3 is a schematic view showing an example of a continuous electrodeposition apparatus for depositing zinc oxide from an aqueous solution to which the present invention is applicable.

Such a zinc oxide layer (transparent conductive layer) 203 of a photovoltaic device as shown in FIG. 2 was formed using the roll-to-roll apparatus shown in FIG. 3.

In the present example, silver was deposited by 200 nm in thickness on a support member 201 made of SUS4302D to previously form a metal layer (back reflected layer) 202, and on the surface of the support member 201/metal layer 202, a zinc oxide layer 203 was formed using the roll-to-roll apparatus shown in FIG. 3.

First, a substrate 303 (the above-described support member 201/metal layer 202) supplied from a rolled substrate 301 is cleaned to wash away dust and dirt on the surface of the substrate in a warm water bath 306 of pure water maintained at 85° C. within a washing tank 305, the substrate 303 is conveyed into a zinc oxide layer forming tank 307 through a conveying roller, a zinc oxide forming bath 308 contains zinc nitrate hexahydrate of 75 g (0.25 mol/L) per liter of water, potassium hydrogen phthalate which is added so as to adjust its concentration to 100 μmol/L, and dextrin of 0.1 g. The bath is circulated to stir the bath. The liquid temperature of the bath is maintained at temperature of 85° C., and pH was held at 4.0 to 6.0. As the counter electrode 309, there was used a zinc plate, the surface of which was subjected to a blasting treatment, the substrate 303 (the above-described support member 201/metal layer 202) was grounded as a negative electrode, and 4.0 mA/m² (0.4 A/dm²) was applied between the positive counter electrode 309 and the negative substrate 303 to carry out electrodeposition. The conveying rate of the substrate was 1000 mm/minute, and the zinc oxide thin film with thickness of 2.5 μm was formed.

Thereafter, as the semiconductor layer 204, n-type amorphous silicon (a-Si), non-doped amorphous silicon (a-Si), and p-type microcrystalline silicon (μc-Si) were deposited by 20 nm, 200 nm and 14 nm in thickness, respectively, in this order by means of the CVD method. Further, ITO was deposited by 65 nm in thickness by means of heating vapor deposition under oxygen atmosphere to form a transparent conductive layer 205 as an upper electrode having an anti-reflection effect. Thereon, a grid made of silver was deposited by means of the heating vapor deposition to form an upper output electrode 206 to produce a photovoltaic device.

This photovoltaic device was measured under artificial sunlight to measure the short circuit current density and the conversion efficiency. Further, this device was left standing under environment of temperature of 85° C. and humidity of 85% for 1000 hours to measure a deterioration rate of the conversion efficiency.

By comparing the results of the above-described measurement with the results of the sample of Example 16, it could be confirmed that the short circuit current, the conversion efficiency and reliability are all on the same level. In other words, it could be confirmed that the production process according to the present invention is applicable to the roll-to-roll system, and sufficient characteristics can be provided.

EXAMPLE 17

Figure 4:
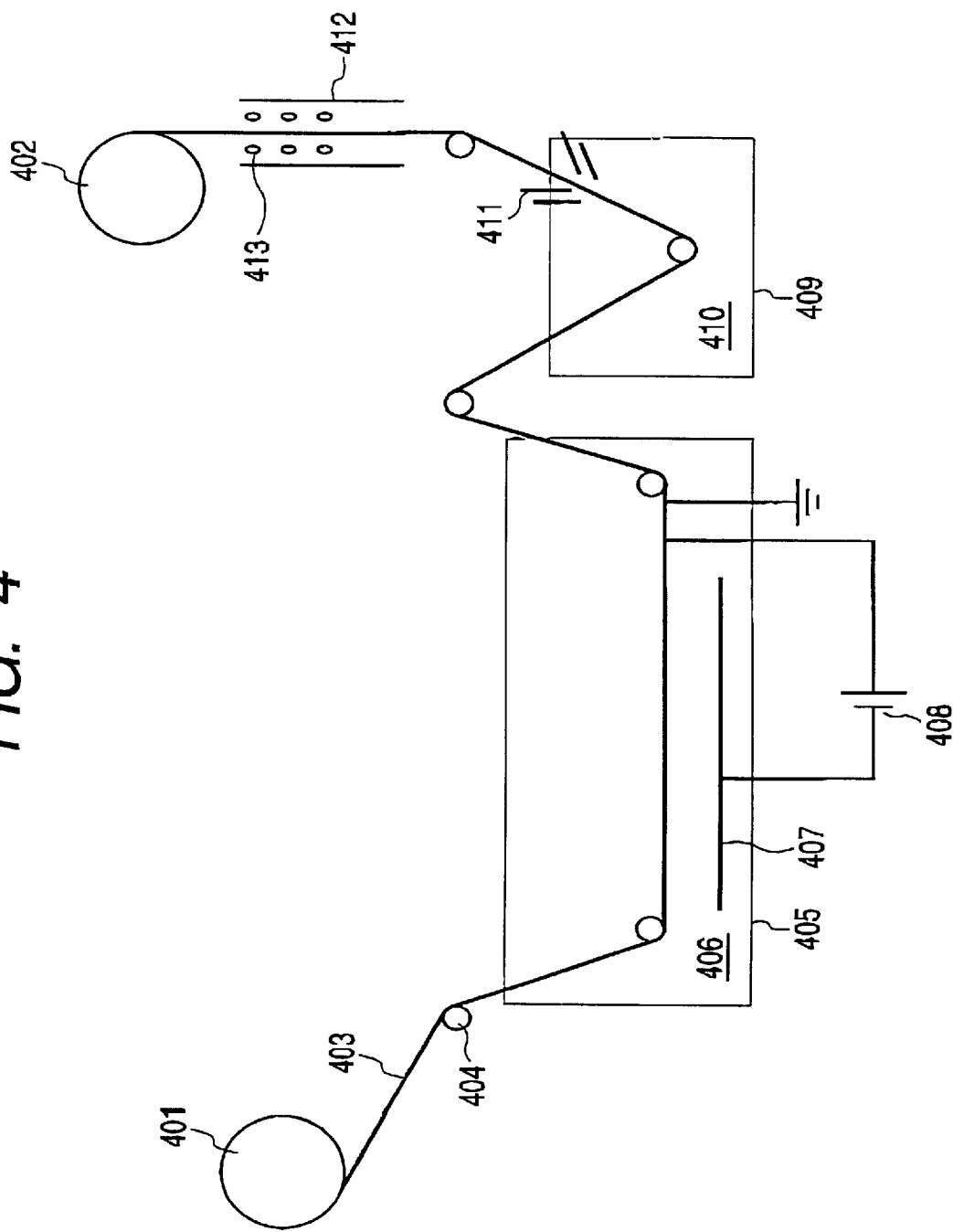
FIG. 4 is a schematic view showing another example of a continuous electrodeposition apparatus for depositing zinc oxide from an aqueous solution to which the present invention is applicable.

A zinc oxide layer (transparent conductive layer) 203 of a photovoltaic device as shown in FIG. 2 was formed by using the roll-to-roll apparatus shown in FIG. 4.

In the present example, silver was previously deposited by 200 nm in thickness on a support member 201 made of SUS4302D by means of a DC magnetron sputtering apparatus corresponding to the roll-to-roll system, and on a surface thereof, a zinc oxide thin film (substrate temperature: 300° C. film formation rate: 2 nm/sec) was deposited by 200 nm in thickness by means of a similar DC magnetron sputtering apparatus corresponding to the roll-to-roll system to form a metal layer (back reflected layer) 202. On a surface of the support member 201/metal layer 202, a zinc oxide layer 203 was formed by using the roll-to-roll apparatus shown in FIG. 4.

A substrate 403 (the above-described support member 201/metal layer 202) supplied from a rolled substrate 401 is conveyed into a zinc oxide layer forming tank 405 through a conveying roller 404. A zinc oxide forming bath 406 contains zinc nitrate hexahydrate of 75 g (0.25 mol/L) per liter of water, potassium hydrogen phthalate which is added so as to adjust its concentration to 100 μmol/L, and dextrin of 0.1 g. The bath is circulated to stir the bath. The liquid temperature of the bath is maintained at temperature of 85° C., and pH is held at 4.0 to 6.0. As the counter electrode 407, there was used a zinc plate the surface of which was subjected to a blasting treatment. As a negative electrode, there was used the substrate 403 (the above-described support member 201/metal layer 202). 4.0 mA/cm² (0.4 A/dm²) was applied between the positive counter electrode 407 and the negative substrate 403. The conveying rate of the substrate was 1000 mm/minute, and the zinc oxide thin film with thickness of 2.5 μm was formed.

On a surface thereof, a conductive layer 204, a transparent electrode layer 205 and an electrode 206 are formed by the same method as used in Example 13 to produce a photovoltaic device. This photovoltaic device was measured under artificial sunlight to measure the short circuit current density and the conversion efficiency. Further, this device was left standing under environment of temperature of 85° C. and humidity of 85% for 1000 hours to measure a deterioration rate of the conversion efficiency.

By comparing the results of the above-described measurement with the results of the sample of Example 15, it could be confirmed that the short circuit current, the conversion efficiency and reliability are all on the same level. In other words, it could be confirmed that the production process according to the present invention is applicable to the roll-to-roll system, and sufficient characteristics can be provided.

EXAMPLE 18

A zinc oxide layer (transparent conductive layer) 203 of a photovoltaic device as shown in FIG. 2 was formed by using the roll-to-roll apparatus shown in FIG. 4.

In the present example, silver was previously deposited by 200 nm in thickness on a support member 201 made of SUS4302D by means of a DC magnetron sputtering apparatus corresponding to the roll-to-roll system, and thereon a zinc oxide thin film (substrate temperature: 150° C., film formation rate: 5 nm/sec) was deposited by 100 nm in thickness by means of a similar DC magnetron sputtering apparatus corresponding to the roll-to-roll system to form a metal layer (back reflected layer) 202. On a surface of the support member 201/metal layer 202, a zinc oxide layer 203 was formed by using the roll-to-roll apparatus shown in FIG. 4.

A substrate 403 (the above-described support member 201/metal layer 202) supplied from a rolled substrate 401 is conveyed into a zinc oxide layer forming tank 405 through a conveying roller 404. A zinc oxide forming bath 406 contains zinc nitrate hexahydrate of 60 g (0.20 mol/L) per liter of water, potassium hydrogen phthalate which is added so as to adjust its concentration to 50 μmol/L, and dextrin of 0.3 g. The bath is circulated to stir the bath. The liquid temperature of the bath is maintained at temperature of 80° C., and pH is held at 4.0 to 5.0. As the counter electrode 407, there was used a zinc plate the surface of which was subjected to a blasting treatment. As a negative electrode, there was used the substrate 403 (the above-described support member 201/metal layer 202). Current density of 12 mA/cm² (1.2 A/dm²) was applied between the positive counter electrode 407 and the negative substrate 403 to carry out electrodeposition. The conveying rate of the substrate was 2000 mm/minute, and the zinc oxide thin film with thickness of 1.8 μm was formed.

Thereafter, as the semiconductor layer 204, n-type microcrystalline silicon (μc-Si), non-dope microcrystalline silicon (μc-Si) and p-type microcrystalline silicon (μc-Si) of the bottom cell were deposited by 10 nm, 2000 nm and 30 nm in thickness, respectively, in this order by means of the CVD method. Further, n-type amorphous silicon (a-Si), non-dope amorphous silicon (a-SI) and p-type amorphous silicon (a-Si) of the top cell were deposited by 10 nm, 500 nm and 30 nm in thickness, respectively, in this order. Furthermore, ITO was deposited by 65 nm in thickness by means of the sputtering apparatus to form a transparent conductive layer 205 as an upper electrode having an anti-reflection effect. On a surface thereof, a grid made of silver was deposited by means of the heating vapor deposition to form an upper output electrode 206, thereby producing a photovoltaic device.

This photovoltaic device was measured under artificial sunlight to measure the short circuit current density and the conversion efficiency. Further, this device was left standing under environment of temperature of 85° C. and humidity of 85% for 1000 hours to measure a deterioration rate of conversion efficiency. The results of the above-described measurement are shown in Table 6.

COMPARATIVE EXAMPLE 5

Except that no potassium hydrogen phthalate was added to the zinc oxide forming bath 406, a zinc oxide film was formed in the same manner as in the case of Example 17 to produce a photovoltaic device.

This photovoltaic device was measured under artificial sunlight to measure the short circuit current density and the conversion efficiency. Further, this device was left standing under environment of temperature of 85° C. and humidity of 85% for 1000 hours to measure a deterioration rate of conversion efficiency. The results of the above-described measurement are shown in Table 6.

TABLE 6

| | Example 18 | Comparative Example 5 |
|---|---|---|
| Short circuit current (%) (Relative comparison with Comparative Example 5) | 1.08 | 1 |
| Conversion efficiency (%) (Relative comparison with Comparative Example 5) | 1.03 | 1 |
| Deterioration rate of conversion efficiency (%) in HH test | 1 | 14 |

From Table 6, the following can be said. Use of a zinc oxide thin film formed in accordance with the present invention makes it possible to produce a photovoltaic device excellent in short circuit current, conversion efficiency and reliability.

EXAMPLE 19

For the experiment, the apparatus shown in FIG. 1 was used. As the negative electrode (conductive substrate) 103, stainless steel 4302D with thickness of 0.12 mm, on which silver was sputtered by 800 nm in thickness, was used, and its back surface was covered with a tape. As the positive electrode (counter electrode) 104, zinc of 4-N with thickness of 1 mm was used. As the aqueous solution 102, 0.25 mol/L zinc nitrate aqueous solution at 85° C. was used, and potassium hydrogen phthalate was further added to the solution so as to adjust the potassium hydrogen phthalate concentration to 100 μmol/L. As the applied current, 4.0 mA/cm² (0.4 A/dm²) was used, and the current was supplied for ten minutes.

On a surface thereof, an n-type Si layer was deposited by 20 μm in thickness by the vacuum evaporation apparatus. When it was investigated by X ray diffraction, the Si layer at this time was made of amorphous Si.

On such an Si layer formed on the SUS substrate, an NSG film is deposited by 2 nm in thickness as a cap layer by means of an atmospheric pressure CVD apparatus, and then the amorphous silicon layer is irradiated from the cap layer side with light of a halogen lamp to fuse and recrystallize the amorphous Si layer.

After the completion of the light irradiation, the NSG film on the recrystallized Si layer is removed by using HF aqueous solution; on the surface of the Si crystal thin film, B is ion-implanted under conditions of 20 keV and $1 \times 10^{15}$/cm²: annealing is performed at 800° C. for 30 minutes to form a p+ layer; on a surface of which a current collection electrode (Ti/Pd/Ag (0.04 μm/0.02 μm/1 μm)/ITO transparent conductive film was formed by means of an EB (Electron Beam) deposition.

This device was measured under artificial sunlight to measure the short circuit current density and the conversion efficiency. Further, this device was left standing under environment of temperature of 85° C. and humidity of 85% for 1000 hours to measure a deterioration rate of conversion efficiency. The results of the above-described measurement are shown in Table 7.

COMPARATIVE EXAMPLE 6

Except that no potassium hydrogen phthalate was added to the aqueous solution 102, a zinc oxide film was formed in the same manner as in the case of Example 21 to produce a photovoltaic device.

This device was measured under artificial sunlight to measure the short circuit current density and the conversion efficiency. Further, this device was left standing under environment of temperature of 85° C. and humidity of 85% for 1000 hours to measure a deterioration rate of conversion efficiency. The results of the above-described measurement are shown in Table 7.

TABLE 7

|  | Example 19 | Comparative Example 6 |
|---|---|---|
| Short circuit current (%) (Relative comparison with Comparative Example 6) | 1.05 | 1 |
| Conversion efficiency (%) (Relative comparison with Comparative Example 6) | 1.02 | 1 |
| Deterioration rate of conversion efficiency (%) in HH test | 1 | 14 |

From Table 7, the following can be said. Use of a zinc oxide thin film according to the present invention makes it possible to produce a photovoltaic device excellent in short circuit current, conversion efficiency and reliability.

According to the present invention, in a zinc oxide film forming method for forming a zinc oxide film on a conductive substrate by dipping a conductive substrate and a counter electrode in an aqueous solution containing at least nitric acid ion and zinc ion to supply a current between these electrodes, it is possible to obtain texture structure which effectively functions for optical confinement in the solar cell.

By introducing the zinc oxide-forming technique according to the present invention into a solar cell-producing process as a back reflected layer, it is possible to increase the short circuit current density and conversion efficiency of the solar cell and to further enhance the yield characteristics and durability. Also, since it is very advantageous (cost of about one two hundredth) in material cost and running costs as compared with the sputtering method and the deposition method, the present invention can contribute to full-scale proliferation of solar-electric power generation.

What is claimed is:

1. A method for forming a zinc oxide film on a conductive substrate, which comprises dipping the conductive substrate and a counter electrode in an aqueous solution containing at least nitric acid ion and zinc ion and supplying a current between the conductive substrate and the counter electrode, wherein the aqueous solution further contains polycarboxylic acid in which a carboxyl radical is bonded to a plurality of carbons having an sp2 hybrid orbital, or its ester, and wherein a concentration of the polycarboxylic acid or its ester is set to 0.5 $\mu$mol/L to 500 $\mu$mol/L.

2. The method according to claim 1, wherein the polycarboxylic acid or its ester is polycarboxylic acid in which a carboxyl radical is bonded to each of adjacent carbons having an sp2 hybrid orbital, or its ester.

3. The method according to claim 1, wherein as the polycarboxylic acid or its ester, phthalic acid or its ester is used.

4. The method according to claim 1, wherein a concentration of the zinc ion is set to 0.05 mol/L or more.

5. The method according to claim 1, wherein as the aqueous solution, an aqueous solution comprising saccharose or dextrin is used.

6. The method according to claim 1, wherein as the conductive substrate, a conductive substrate having a zinc oxide film deposited thereon in advance is used.

7. A process for producing a photovoltaic device comprising a zinc oxide film, comprising the steps of forming the zinc oxide film by the method set forth in claim 1, and forming a semiconductor layer on the zinc oxide film.

* * * * *

UNITED STATES PATENT AND TRADEMARK OFFICE
CERTIFICATE OF CORRECTION

PATENT NO. : 6,576,112 B2
DATED : June 10, 2003
INVENTOR(S) : Yuichi Sonoda et al.

It is certified that error appears in the above-identified patent and that said Letters Patent is hereby corrected as shown below:

<u>Title page,</u>
Item [56], References Cited, OTHER PUBLICATIONS, "Technical Disgest" should read -- Technical Digest --.

<u>Column 5,</u>
Line 10, "an uniform" should read -- a uniform --.

<u>Column 7,</u>
Line 47, "Resides" should read -- Besides --.

<u>Column 8,</u>
Line 20, "wave length" should read -- wavelength --.

<u>Column 12,</u>
Lines 16 and 62, "Beside" should read -- Besides --.

<u>Column 13,</u>
Line 26, "Beside" should read -- Besides --.

<u>Column 14,</u>
Line 35, "Beside" should read -- Besides --.

<u>Column 16,</u>
Lines 20 and 43, "Beside" should read -- Besides --.

Signed and Sealed this

Ninth Day of December, 2003

JAMES E. ROGAN
*Director of the United States Patent and Trademark Office*